United States Patent [19]

Diamond

[11] 3,836,861

[45] Sept. 17, 1974

[54] LOW DISSIPATION POWER AMPLIFIER

[75] Inventor: Allen M. Diamond, Orange, Calif.

[73] Assignee: Beckman Instruments Inc., Fullerton, Calif.

[22] Filed: Mar. 2, 1973

[21] Appl. No.: 337,420

[52] U.S. Cl. ........................ 330/15, 330/9, 330/30 D

[51] Int. Cl. ............................................ H03f 3/26

[58] Field of Search .................. 330/9, 15, 30 D, 69

[56] References Cited

UNITED STATES PATENTS

| | | | |
|---|---|---|---|
| 3,077,566 | 2/1963 | Vosteen | 330/9 X |
| 3,237,117 | 2/1966 | Collings et al. | 330/9 |

*Primary Examiner*—Herman Karl Saalbach
*Assistant Examiner*—Lawrence J. Dahl
*Attorney, Agent, or Firm*—R. J. Steinmeyer; J. G. Mesaros

[57] ABSTRACT

A push-pull amplifier utilizing substantially identical first and second transistors, the collector of the first transistor being directly coupled to the base of the second transistor, the base of the first transistor being coupled through a resistor to the emitter of the second transistor. The bias for the first transistor is supplied through an operational amplifier through a current limiting resistor to the base thereof, while the bias to the second transistor is controlled by a feedback loop interconnecting the base thereof and the input of the operational amplifier. A diode is connected between the emitter and base of the second transistor to prevent conduction of both transistors at the same time.

2 Claims, 1 Drawing Figure

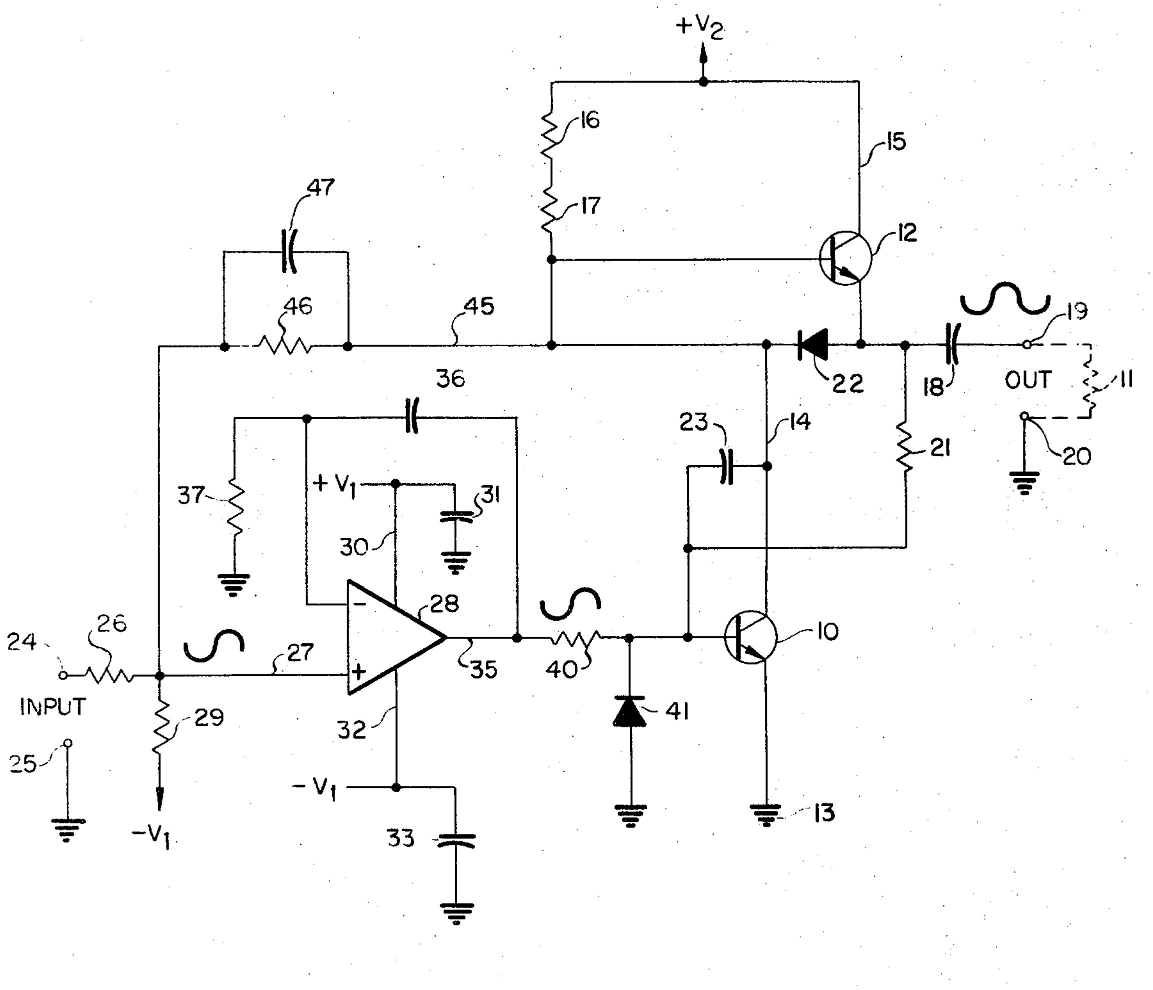
+V2
16
17
15
12
47
46
45
22
19
OUT
11
18
36
23
14
21
20
37
+V1
31
30
28
24
26
27
10
35
40
INPUT
41
29
25
32
-V1
13
-V1
33

LOW DISSIPATION POWER AMPLIFIER

BACKGROUND OF THE INVENTION

In push-pull transistor amplifiers, it is often necessary to incorporate a transformer at the input to the amplifier. In addition it is often times necessary to place a transformer in the output circuit for impedance matching purposes. In either event the incorporation of a transformer introduces into the system a frequency response dependent upon the frequency response of the transformer. In other push-pull transistor amplifiers phase shifters are often employed to ensure that the output wave is a true representation of the input wave. Some push-pull circuits attempt to use complementary pairs of transistors in the output stage, which often creates the problem of mismatch in the output. Furthermore, such circuits must be temperature-stabilized inasmuch as when the transistors conduct current, they heat up, resulting in a change in the voltage from the base to the emitter of approximately 2 mv/°C. In order to compensate for this the *dc.* bias of both transistors must be controlled as a function of temperature.

SUMMARY OF THE INVENTION

Accordingly it is an object of the invention to provide a new and improved push-pull amplifier.

It is another object of this invention to provide a push-pull amplifier utilizing substantially identical transistors in the power output stage.

It is a further object of this invention to provide a push-pull amplifier having the *dc.* bias of a first transistor controlled through an operational amplifier, with the *dc.* bias of the second transistor being controlled by means of a feedback loop.

It is still another object of this invention to provide blocking means in a push-pull amplifier to prevent conduction of both transistors at the same time.

The foregoing and other objects of the invention are accomplished by providing substantially identical first and second transistors, the collector of the first transistor being directly coupled to the base of the second transistor. A diode interconnects the emitter and base of the second transistor. The diode prevents both transistors from being conductive at the same time. The bias for the first transistor is supplied through an operational amplifier through a current limiting resistor to the base. The bias for the second transistor is provided by a negative feedback loop interconnecting the base of the second transistor with the input of the operational amplifier, this input likewise receiving the input signal to the circuit.

Other objects, features and advantages of the invention will become apparent from the following specification taken in conjunction with the accompanying drawing.

BRIEF DESCRIPTION OF THE DRAWING

The sole FIGURE is a schematic diagram of a low dissipation power amplifier in accordance with the invention.

DESCRIPTION OF THE PREFERRED EMBODIMENT

Circuit Description

Referring now to the drawing, there is shown a push-pull transistor amplifier, having a first NPN transistor 10 and a second substantially identical NPN transistor 12. The emitter of transistor 10 is connected to common or ground 13 while the collector thereof is connected by means of lead 14 to the base of transistor 12. The collector of transistor 12 is coupled through lead 15 to a voltage source $+V_2$ (150 VDC), while the voltage source is likewise connected to the base of transistor 12 through series resistors 16 (4.3 K ohms) and 17 (3.9 K ohms). The emitter of transistor 12 is connected through blocking capacitor 18 (50 microfarads) to output terminals 19 and 20 having a load 11 (in dotted lines) thereacross. The emitter of transistor 12 is also coupled through resistor 21 (10 K ohms) to the base of transistor 10. The emitter of transistor 12 is also connected to the anode of diode 22 which has the cathode thereof coupled to both the base of transistor 12 and the collector of transistor 10. A phase compensating capacitor 23 (1,000 picofarads) interconnects the collector and base of transistor 10.

The input to the power amplifier is provided at a pair of input terminals 24 and 25 through a current-limiting resistor 26 (6.8 K ohms) through lead 27 to the input of operational amplifier 28. Lead 27 is also coupled to a negative voltage source $-V_1$ (15 VDC) through a resistor 29 (68 K ohms). Operational amplifier 28 is suitably biased over lead 30 from a positive voltage source $+V_1$ (15 VDC), with the voltage source also being coupled to ground through a power supply bypass capacitor 31 (0.1 microfarads), with the negative bias being supplied through lead 32 to a negative voltage source $-V_1$ which is likewise coupled to ground through a power supply bypass capacitor 33 of the same value as capacitor 31. The output on lead 35 of operational amplifier 28 is coupled to a phase-compensating capacitor 36 (1,000 picofarads) to the inverting input of operational amplifier 28, which is likewise coupled to ground through resistor 37 (10 K ohms). Resistor 37 is a *dc* bias and balancing resistor for amplifier 28. The output on lead 35 passes through current-limiting resistor 40 (100 ohms) to the base of transistor 10, the base of transistor 10 also being connected to the cathode of a clipping diode 41 having the anode thereof coupled to ground. Diode 41 limits the reverse biasing of transistor 10 to less than 1 volt.

A feedback loop is provided from the base of transistor 12 over lead 45 through resistor 46 (300 K ohms) to lead 27 which is the input to operational amplifier 28. Connected in parallel with resistor 46 is a phase-compensating capacitor 47 (1,000 picofarads).

Circuit Operation

Transistors 10 and 12 are the power output stage and are operated in the class B amplifying mode. The negative portion of the output signal appearing at load 11 across output terminals 19 and 20 is supplied by transistor 10 while transistor 12 supplies the power for the positive portion of the output signal. The bias for transistor 10 is supplied through operational amplifier 28 through resistor 40 while the bias for transistor 12 is supplied by resistors 16 and 17. The quiescent *dc* voltage at the emitter of transistor 12 is determined by the voltage divider formed by resistors 46 (in the feedback loop) and resistor 29.

The gain of the overall amplifier is controlled by the ratio of the resistance of resistor 46 to the resistance of resistor 26, while the gain of the power output stage (transistors 10 and 12) is controlled by resistors 21 and 40.

In the original condition with no alternating current signal applied to input terminals 24 and 25 the base voltage of transistor 12 is at a voltage level determined by the ratio of the resistances of resistor 46 to resistor 29, with the base current being provided from the voltage source $+V_2$ to resistors 16 and 17. Excess current passes through transistor 10 to ground 13 in which case transistor 12 will be virtually off, except for a negligible amount of current passing through the emitter through resistor 21.

In the quiescent condition (no input signal at terminals 24 and 25) current flows from voltage source $+V_2$ through series resistors 16 and 17 through feedback resistor 46 through resistor 29 to the negative voltage source $-V_1$. This current flowing through resistor 29 is sufficient to raise the potential on lead 27 to a voltage above ground or above the inverting input of operational amplifier 28. As lead 27 (the noninverting input to operational amplifier 28) is being driven positive, this will cause the output appearing on lead 35 to go positive, rendering transistor 10 conductive. Transistor 10 will now conduct enough current through the path from the voltage source $+V_2$ through resistors 16 and 17 to lower the voltage on lead 45 to the point that the current flow through resistor 46 will just be sufficient to maintain the voltage on lead 27 to operational amplifier 28 at ground. A slight amount of current will flow into the base of transistor 12 causing transistor 12 to supply enough current to keep the voltage potential on its emitter about equal to the voltage of lead 45. The current through resistor 21 (connected between the emitter of transistor 12 and the base of transistor 10) has two possible conductive paths: (1) through the base of transistor 10 to ground or (2) through resistor 40 into the output of operational amplifier 28 through lead 32 to the negative source of bias potential $-V_1$ of operational amplifier 28. The actual flow of the current will be determined in accordance with the following. If it is not sufficient to supply the required base drive for transistor 10 to maintain the voltage on lead 45, all of the current will flow into the base of transistor 10 with whatever additional current needed to maintain the voltage on lead 45 being supplied by operational amplifier 28. If the current through resistor 21 is greater than that needed by transistor 10, lead 45 will drop below its design voltage, causing lead 27 (noninverting input to operational amplifier 28) to go negative. This will cause the output of operational amplifier 28 appearing on lead 35 to go negative, supplying a current sink for the excess current, until the net current into the base of transistor 10 is at the proper level to hold the voltage of lead 45 at the design value.

Current can never flow through transistor 12 and transistor 10 to common. This is because the collector of transistor 10 is connected to the base of transistor 12 and in order for transistor 12 to conduct, its emitter must be about 0.7 volts below its base. This reverse biases diode 22 preventing current flow. In prior art push-pull amplifiers the power output means such as transistors or tubes utilized in such push-pull amplifiers generally provide a conductive path through both transistors of the power output stage from the voltage source to ground. As a net consequence a thermal gradient is introduced changing the voltage across the transistors in proportion to the heat generated. As the transistors heat up more current is required, the additional current providing more heat, which, unless temperature stabilization is utilized, results in a condition known as thermal runaway. In this condition the current through the devices can exceed the temperature limit of the power output device resulting in destruction of the device. In the instant application under no condition does current flow from transistor 12 through transistor 10, thus eliminating a major problem.

When an alternating current signal is applied to the inputs 24 and 26, as input terminal 24 goes positive current flows through resistor 26 through lead 27, lead 27 being a summing junction which is a virtual ground, the current through resistor 26 has no place to go except through resistor 29, thereby attempting to raise the voltage of lead 27. This will cause the output of operational amplifier 28 appearing on lead 35 to go positive to supply more current into the base of transistor 10. Transistor 10 will now conduct more current causing the voltage at lead 45 to decrease, supplying less current through resistor 26. This will continue until the current decrease in resistor 46 is equal to the current supplied through resistor 26, thereby keeping the current flow through resistor 29 constant and the voltage appearing at the input of operational amplifier on lead 27 essentially constant. Under this condition with transistor 10 conducting, diode 22 is reverse biased as previously mentioned.

As the input signal at terminal 24 goes negative, the output appearing on lead 35 of operational amplifier 28 will go negative decreasing the current through transistor 10 causing the voltage on lead 45 to rise until it has sufficient voltage to cause it to supply an equal amount of additional current into the summing junction on lead 27 to supply the current that is flowing out through resistor 26 into the negative signal.

Current to the load 11 is supplied as follows: when the input signal is positive (a negative swing at the load 11) current flows through capacitor 18, diode 22 and transistor 10 to ground 13. During the opposite half cycle current is supplied through transistor 12, which is now conductive by virtue of lead 45 going positive, this current flowing out through capacitor 18 into the load.

Under no condition does current flow from transistor 12 through transistor 10 since diode 22 effectively prevents both transistors from being conductive at the same time. Consequently it can be seen that the previously described circuit results in a low power dissipation amplifier having minimal temperature problems.

While there has been shown and described a preferred embodiment, it is to be understood that various other adaptations and modifications may be made within the spirit and scope of the invention.

I claim:

1. In a push-pull amplifier for supplying power to an output load, the combination comprising:
   - substantially identical first and second transistors each of said transistors having a base, collector and emitter electrode;
   - an operational amplifier having the output thereof coupled to the base of said first transistor for controlling the bias thereof, the emitter of said first transistor being coupled to ground potential and the collector thereof being coupled to the base of said second transistor, the base and collector of said second transistor being connected to other bias means with the emitter thereof being coupled through resistance means to the base of said first transistor;

input means for providing an alternating current signal to said operational amplifier;

a diode connected in the nonconductive direction of the base to emitter path of said second transistor, said diode being operative in response to said first transistor for rendering said second transistor nonconductive;

a feedback loop coupled between the base of said second transistor and the input to said operational amplifier, said feedback loop controlling the base voltage of said second transistor in response to said alternating current signal; and output means coupled to the emitter of said second transistor for supplying power to an output load, said operational amplifier, said bias means, said diode and said feedback loop alternately rendering said first and second transistors conductive in response to alternate half cycles of said alternating current signal.

2. The combination according to claim 1 wherein said feedback loop includes a first series resistor and said input means includes a second resistor in series with said alternating current signal, the gain of said amplifier being controlled by the ratio of the value of said first resistor to said second resistor.

* * * * *